Oct. 28, 1969 W. A. PLICE 3,475,749
DIGITAL-TO-ANALOG CONVERTER APPARATUS
Filed April 5, 1966
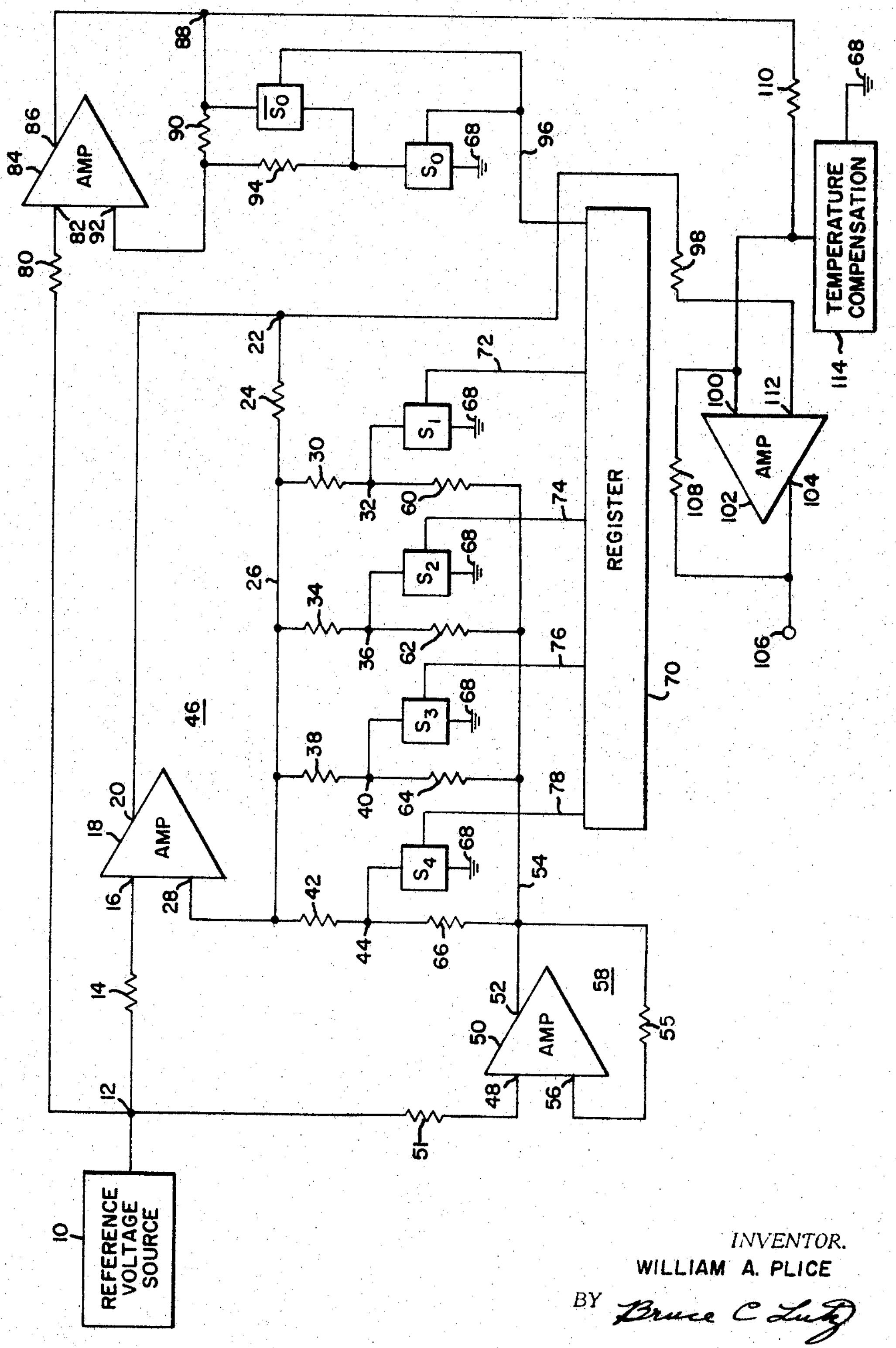
INVENTOR.
WILLIAM A. PLICE
BY Bruce C Lutz
ATTORNEY United States Patent Office 3,475,749
Patented Oct. 28, 1969

3,475,749
DIGITAL-TO-ANALOG CONVERTER APPARATUS
William A. Plice, Minnetonka, Minn., assignor to Honeywell Inc., Minneapolis, Minn., a corporation of Delaware
Filed Apr. 5, 1966, Ser. No. 540,296
Int. Cl. H04l 3/00; H03k 13/00
U.S. Cl. 340—347 7 Claims

ABSTRACT OF THE DISCLOSURE

A digital-to-analog converter of the operational amplifier type is shown wherein switches are selectively operated to connect weighted resistors between the input of the amplifier and ground. Other resistors are connected between the junctions of the weighted resistors and the switches and a source of potential which resistors are small relative to the associated weighted resistors. The source of potential is maintained at approximately the input potential of the amplifier so that the leakage currents of the switches and the charging currents for the switch capacitances are supplied through the small resistors rather than the weighted resistors.

This invention pertains generally to computing apparatus and more specifically to digital-to-analog converters.

One of the simplest types of D/A converters known in the prior art is shown in FIGURE 5—26, on page 5—47, of A. K. Susskind, Notes on Analog-Digital Conversion Techniques, The Technology Press, M.I.T., 1957. This converter is essentially an operational amplifier with a variable resistance feedback. The resistance is varied by operating shunt switches to short various segments of resistor. Mechanical switches may be used satisfactorily in this converter if the operating speed is low. However, for long life and high speed operation, transistor switches must be used. Two disadvantages of transistor switches are immediately obvious. They are offset voltage and leakage current. Offset voltage is the voltage across the switch when the switch is closed and leakage current is the current that flows through an open switch. In the converter shown on page 5—47 of Susskind, offset voltages and leakage currents are additive so that even small errors in each switch add to provide appreciable error.

A second type of D/A converter is a ladder network which may take on various configurations. Some of these configurations are shown in FIGURES 5—17 to 5—25 of Susskind. These converters minimize the effect of offset voltage, however, the problem of open circuit leakage current remains. As transistor switches with very low offset voltages are available, and as the effect of offset voltage in ladder network D/A converters is not additive, the errors due to offset voltage of the switches are minimal.

Another disadvantage of the switching arrangement shown in the prior art is that each switch has an equivalent capacitance which must be neutralized when the switch is operated. This equivalent capacitance has the effect of decreasing the effective switching speed.

In this invention, a type of ladder network is inserted into the feedback loop of an operational amplifier. In the prior art converters shown in Susskind, switches are inserted in series with each of the resistors, however, as was explained above, leakage current through the switches gives rise to errors in the analog output voltage.

In this invention, a feedback circuit is connected from an output to an input of an amplifier. The amount of feedback can be varied by operating a set of switches which are in series with a set of resistors to alternatively connect one end of the resistors to a common conductor. These switches are operated in accordance with a digital signal to provide a D/A converter wherein the output voltage of the amplifier is an analog representation of the digital signals impressed on the switches. Various weighting schemes for the resistors in the feedback circuit will be evident to those skilled in the art. The switches normally will be transistor switches which would normally give rise to errors in the output voltage of the converter due to leakage currents through the transistors. However, in this invention, a second set of resistors are connected to the various junction points between the resistors in the feedback circuit and the switches. The second end of each of the second resistors is connected to a reference potential. If this reference potential is made substantially equal to the potential of the feedback loop (i.e., to the input of the amplifier), substantially all of the leakage current through the switches will be provided by current through the second resistor if the second resistors are small by comparison to the resistors in the feedback circuit. Also, when the second resistors are small, the effective switching speed is increased because the equivalent capacitance of the switch is discharged through a smaller resistance.

Accordingly, it is an object of this invention to provide an improved digital-to-analog converter.

It is a further object of this invention to provide improved accuracy in a digital-to-analog converter by using a novel switching arrangement therein.

These and other objects of this invention will become evident to those skilled in the art upon a reading of this specification and the appended claims in conjunction with the drawing which is a circuit diagram of the preferred embodiment of this invention.

Referring now to the drawing, there is shown a source of reference potential or voltage 10 with an output connected to a junction point 12. Source 10 supplies a reference voltage $E_r$ to junction point 12. Junction point 12 is connected by means of a resistor 14 to a first input 16 of an amplifying means or amplifier 18. Amplifier 18 has an output 20 connected to a junction point 22. Junction point 22 is further connected by means of a resistor 24 in series with a conductor or lead 26 to a second input 28 of amplifier 18. Lead 26 is connected by means of resistors 30, 34, 38, and 42 to junction points 32, 36, 40 and 44, respectively. Resistors 30, 34, 38, and 42 comprise a scheme of weighted resistors connected to the feedback loop of amplifier 18. Amplifier 18 and its associated circuitry comprise an operational amplifier 46.

Junction point 12 is further connected to a first input 48 of amplifying means or amplifier 50 by means of a resistor 51. Amplifier 50 has an output 52 connected to a conductor or lead 54 and further connected by means of a resistor 55 to a second input 56 of amplifier 50. Amplifier 50 and its associated circuitry comprise a means for providing a substantially constant or predetermined reference potential 58. It is to be understood that in the operation of this invention, amplifier 50 supplies a substantially constant potential to lead 54, however, loading at the output of amplifier 50 may cause some deviation from a constant potential. However, amplifier 50 may be designed such that in the usual case such deviations are negligible. Other methods of providing a constant potential to lead 54 may also be utilized.

Lead 54 is connected by means of resistors 60, 62, 64, and 66 to junction points 32, 36, 40, and 44, respectively. Junction points 32, 36, 40, and 44 are connected by means of switches $S_1$, $S_2$, $S_3$, and $S_4$, respectively, to a common conductor, or ground 68.

There is further shown a register 70 which is adapted to receive or contain a binary number. The most significant bit output of register 70 is connected to a control terminal of switch $S_1$ by means of a lead 72. The next most significant bit output of register 70 is connected by means of a lead 74 to a control terminal of switch $S_2$. The next most significant bit output of register 70 is connected by means of a lead 76 to a control terminal of switch $S_3$. The least significant bit output of register 70 is connected by means of a lead 78 to a control terminal of switch $S_4$.

It is to be realized that a four bit converter is being described in this specification. However, the principles described herein may be extended to any number of bits as is desired. Accordingly, this invention is not intended to be limited to a four bit converter. It is also to be understood that generally it will be desired to use transistors as switches, however, many switching circuits will operate satisfactorily if used as switches in this invention.

Junction point 12 is further connected by means of a resistor 80 to an input 82 of an amplifying means of amplifier 84 which has an output 86 connected to a junction point 88. Junction point 88 is connected by means of a resistor 90 to a second input 92 of amplifier 84. Junction point 88 is further connected by means of a switch $\overline{S}_0$ in series with a switch $S_0$ to ground 68. Input 92 of amplifier 84 is further connected by means of a resistor 94 to the junction point between switches $S_0$ and $S_0$. A sign bit output of register 70 is connected by means of a conductor 96 to a control terminal of each of switches $\overline{S}_0$ and $S_0$.

Junction point 22 is further connected by means of a resistor 98 to an input 112 of a summing means, amplifying means, or amplifier 102. Amplifier 102 has an output 104 connected to an output terminal 106 and further connected by means of a resistor 108 to an input 100 of amplifier 102. Junction point 88 is further connected by means of a resistor 110 to input 100 of amplifier 102. Input 100 is further connected by means of a temperature compensation circuit 114 to ground 68.

To understand the operation of this invention, assume that resistors 24, 90, and 94 each have a resistance R. Assume that resistor 30 has twice the resistance of resistor 24 or a resistance of 2R. Resistor 34 has a resistance 4R, resistor 38 has a resistance 8R, and resistor 42 has a resistance 16R. It is to be realized that resistors of the values described are applicable to a binary code. If the binary input signal is, for example, a coded decimal signal, it will be necessary to use a different weighted resistor scheme. These modifications of this invention will be evident to those skilled in the art.

Assume that amplifier 18 provides a voltage $E_a$ at junction point 22 in response to an input voltage $E_r$ from reference voltage source 10. Then $E_a$ is given by the formula $$E_a=(E_r-E_1)K \qquad (1)$$

where $E_1$ is the feedback voltage applied to input 28 and K is a constant of amplifier 18. As the inputs to amplifier 18 are high impedance, the current flow through and the voltage drop across resistor 24 is negligible. Then, $E_1=E_a$ and equation (1) reduces to $$E_a=[K/(K+1)]E_r \qquad (2)$$

If K is large, $E_a=E_r$. The same effect may be obtained by designing amplifier 18 such that the resistance looking in from point 28 is equal to the resistance of resistor 14.

Amplifier 50 operates in substantially the same manner as amplifier 18. The resistances of resistors 51 and 55 are equal so that the volt drops across them are equal. Thus, conductors 26 and 54 are both at substantially the same potential. As resistors 60, 62, 64, and 66 are small by comparison to resistors 30, 34, 38, and 42, substantially all of the leakage current through the switches is supplied by current through resistors 60–66. Accordingly, negligible current flows through resistors 30, 34, 38, and 42 so that the volt drop across these resistors is also negligible. Thus, the accuracy of the D/A converter is improved by decreasing the effect of leakage current through the feedback resistors.

Now assume that register 70 provides a binary "1" output on lead 72 such that switch $S_1$ is closed and junction point 32 is substantially grounded. Current flowing to resistor 60 will be shunted to ground through switch $S_1$ and will not affect resistor 30. Current will flow from output terminal 20 of amplifier 18 through resistors 24 and 30 to ground 68.

The potential of conductor 26 is the same as the volt drop across resistor 30 which is given by $$E_1=2Ri=E_a-iR \qquad (3)$$

where is the current through resistor 30. Solving Equation 3 for $E_a$ $$E_a=3Ri \text{ or } i=E_a/3R \qquad (4)$$

and $$E_1=(2/3)E_a \qquad (5)$$

Substituting (5) into (1) and solving for $E_a$ gives $$E_a=3KE_r/(3+2K) \qquad (6)$$

or assuming K is large $$E_a=(1+½)E_r \qquad (7)$$

When switch $S_2$ is closed in addition to $S_1$, it may be determined that $E_a$ is given by $$E_a=(1+½+¼)E_r \qquad (8)$$

Equation (8) may be generalized to $$E_a=(1+a_1 2^{-1}+a_2 2^{-2}+\ldots+a_m 2^{-m})E_r \qquad (9)$$

where $a_m$ is the $m$th binary bit of register 70 and is either zero or one. Equation 9 is an extension to an arbitrary number of binary stages. Equation 9 gives the potential at junction point 22 which is an analog equivalent of the number contained on register 70.

It may be verified that the potential of conductor 26 remains substantially constant and independent of which switches $S_1$–$S_4$ are closed. For example, assume that switch $S_1$ is closed. Then, from Equations 1 and 5

$$(3/2)E_1=K(E_r-E_1) \qquad (10)$$

or $$E_1-[2K/(2K+3)]E_r \qquad (11)$$

As K is large, $E_1=E_r$.

A similar verification mya be made for any other condition of switches $S_1$–$S_4$. As a practical matter, there may be some loading on the amplifiers, however, such errors will be substantially smaller than the errors in prior art systems due to leakage currents through the switches.

This invention also provides a switching system capable of faster operation than prior art switching systems. Normally, without resistors 60–66 the equivalent capacitance of the switches must be discharged or charged through resistors 30, 36, 40, and 44. The time constant is then $t=2^nRC$ where $n$ depends on the position of the switch. However, with resistors 60–66 in the circuit, the equivalent capacitance is discharged through resistors 60–66 and the time constant is $t=R_1C$ where $R_1$ is the resistance or resistor 60–66. If $R_1$ is smaller than R, this time constant is much shorter thereby providing for faster effective switching of switches $S_1$–$S_4$.

Above it was stated that the potentials of conductors 54 and 26 and the potential of source 10 are substantially equal to each other. These potentials may vary due to loading effects and other effects; however, the variations are not great enough to serously affect the operation of the circuit. Thus, the potentials are effectively equal to each other where effectively equal means that the variations from equality are small enough so that any errors due to the variations from equality are smaller than the errors overcome by this invention.

One additional feature of this invention is that the output voltage from reference voltage source 10 does not have to be any particular voltage and may even be a varying voltage. An example of an application for a digital-to-analog converter which can accept a varying input voltage is my copending application, Ser. No. 336,668, filed Jan. 9, 1964, and assigned to the same assignee as the present invention (now abandoned).

Amplifiers 84 and 102, together with their associated circuitry, provide a two's complement converter. That is, this circuitry provides a converter which is able to accept binary signals in two's complement notation from register 70. A sign bit provided by register 70 is applied via conductor 96 to switches $S_0$ and $\overline{S}_0$. A binary "1" output signal from register 70 closes switch $S_0$ and opens switch $\overline{S}_0$. Similarly, a binary "0" output from register 70 opens switch $S_0$ and closes switch $\overline{S}_0$. When switch $\overline{S}_0$ is closed, the potential at junction point 88 is equal to $E_r$. When switch $S_0$ is closed, the potential at junction point 88 is $2E_r$. These relationships are obtained when the resistance of resistor 80 is equal to the parallel equivalent resistance of resistors 90 and 94.

This relationship may be expressed in the notation of Equation 9 as $$E_b=(1+a_0)E_r \quad (12)$$

where $E_b$ is the potential at junction point 88.

The output from amplifier 102 is the difference between $E_a$ and $E_b$ so that the potential at terminal 106 is $$E_0=E_a-E_b \quad (13)$$

where $E_0$ is the output signal. In the notation of Equation 9

$$E_0=(-a_0+a_1 2^{-1}+a_2 2^{-2}+ \ldots +a_m 2^{-m})E_r \quad (14)$$

Thus, $E_0$ is the analog equivalent of a two's complement number contained in register 70. When $a_0$ is zero, an output $E_0=NE_r$ is provided, where N is the digital number in registor 70. When $a_0$ is one, $E_0=(N-1)E_r$ which is in accordance with the two's complement convention of representing negative numbers.

The circuit shown and described herein is the preferred embodiment of my invention, however, those skilled in the art will realize that various modifications may be made within the spirit of my invention. Accordingly, I do not wish to be limited to the specific embodiment shown and described herein but only by the scope of the appended claims.

I claim as my invention:

1. A digital-to-analog converter comprising, in combination:
   - amplifier means including input means, output means, and feedback means connected from said output means to said input means;
   - a first source of reference potential connected to said input means of said amplifier means;
   - a plurality of first resistors;
   - means connecting a first end of each of said first resistors to said input means of said amplifier means;
   - a plurality of second resistors having a low resistance relative to the resistance of said first resistors and each having a first end therof connected each to a second end of a corresponding one of said first resistors;
   - a plurality of switch means connected each from the second end of a corresponding one of said first resistors to a second source of reference potential;
   - means for providing a third reference potential connected to a second end of each of said second resistors whereby the second end of each of said second resistors is manitained at a predetermined potential effectively equal to the potential of said input means; and
   - means connected to each of said switch means for operating said switch means in accordance with a digital signal whereby the voltage at said output means of said amplifier means varies in accordance with the numerical value of the digital signal.

2. A converter as defined in claim 1 wherein said means for providing a third reference potential includes a second amplifier means having input means and output means, means connecting the output means of said second amplifier means to the input means of said second amplifier means, means connecting said first source of reference potential to the input means of said second amplifier means, and means connecting the output means of said second amplifier means to the second end of each of said second resistors.

3. A converter as defined in claim 1 wherein said plurality of first resistors are weighted such that each successive resistor has substantially twice the resistance of the preceding resistor.

4. A digital-to-analog converter comprising, in combination:
   - an amplifier having input means and output means;
   - a source of first reference potential connected to said input means;
   - first resistance means connecting said output means of said amplifier to said input means;
   - a plurality of second resistance means connected to said input means of said amplifier;
   - a plurality of third resistance means having a low resistance relative to the resistance of said second resistance means and having a first end of each of said third resistance means connected each to a corresponding one of said second resistance means;
   - a plurality of switch means connected each to a corresponding one of the junctions between said second and third resistance means whereby each of said switch means, when activated, connects the corresponding junction to a second reference potential;
   - means for providing a third reference potential connected to said third resistance means for maintaining a second end of each of said third resistance means at a potential effectively equal to the potential of said input means; and
   - register means connected to said switch menas for operating said switch means in accordance with digital signals.

5. A converter as defined in claim 4 in combination with:
   - a second amplifier having input means and output means;
   - means connecting said source of first reference potential to said input means of said second amplifier;
   - fourth resistance means connected between said output means of said second amplifier and said input means of said second amplifier;
   - fifth resistance means connected to said input means of said second amplifier;
   - second switch means connected to said fifth resistance means and to said register means, said second switch means operable to connect said fifth resistance means in parallel with said fourth resistance means in response to a first signal from said register means and to connect said fifth resistance means between said input means of said second amplifier and said second reference potential in response to a second signal from said register means; and
   - means connected to said output means of said first amplifier and to said output means of said second amplifier for forming the difference between signals from said first and second amplifier.

6. A converter as defined in claim 5 in which said plurality of second resistance means are weighted such that each successive resistance means has substantially twice the resistance of the preceding resistance means.

7. A converter as defined in claim 5 in which said first, fourth, and fifth resistance means have substantially equal resistance and the resistance of each of said second resistance means is an integral multiple of the resistance of said first resistance means.

References Cited

UNITED STATES PATENTS

| | | | |
|---|---|---|---|
| 3,146,438 | 8/1964 | Peterson et al. | 340—347 |
| 3,180,939 | 4/1965 | Hall | 340—347 X |
| 3,396,381 | 8/1968 | Aitken | 340—347 |

OTHER REFERENCES

Susskind, Notes on Analog-Digital Conversion Technique, The Technology Press, MIT, 1957. (pp. 5–46 to 5–48 relied on.)

MAYNARD R. WILBUR, Primary Examiner

G. R. EDWARDS, Assistant Examiner